United States Patent
Park et al.

(10) Patent No.: US 10,044,003 B2
(45) Date of Patent: Aug. 7, 2018

(54) METAL ENCAPSULANT HAVING GOOD HEAT DISSIPATION PROPERTIES, METHOD OF MANUFACTURING SAME, AND FLEXIBLE ELECTRONIC DEVICE ENCAPSULATED IN SAID METAL ENCAPSULANT

(71) Applicant: POSCO, Pohang-si, Gyeongsangbuk-do (KR)

(72) Inventors: Young-Jun Park, Incheon (KR); Kyoung-Bo Kim, Incheon (KR); Moo-Jin Kim, Incheon (KR); Soo-Cherl Lee, Gwangyang-si (KR); Jae-Ryung Lee, Incheon (KR)

(73) Assignee: POSCO, Pohang-si, Gyeongsangbuk-do (KR)

( * ) Notice: Subject to any disclaimer, the term of this patent is extended or adjusted under 35 U.S.C. 154(b) by 122 days.

(21) Appl. No.: 15/102,847

(22) PCT Filed: Dec. 19, 2014

(86) PCT No.: PCT/KR2014/012606
§ 371 (c)(1),
(2) Date: Jun. 8, 2016

(87) PCT Pub. No.: WO2015/093903
PCT Pub. Date: Jun. 25, 2015

(65) Prior Publication Data
US 2016/0359134 A1    Dec. 8, 2016

(30) Foreign Application Priority Data

Dec. 20, 2013  (KR) .................. 10-2013-0160819

(51) Int. Cl.
*H01L 51/52* (2006.01)
*B32B 9/00* (2006.01)
(Continued)

(52) U.S. Cl.
CPC ............ *H01L 51/529* (2013.01); *B32B 9/007* (2013.01); *B32B 9/041* (2013.01); *B32B 15/08* (2013.01);
(Continued)

(58) Field of Classification Search
None
See application file for complete search history.

(56) References Cited

U.S. PATENT DOCUMENTS 3,440,181 A * 4/1969 Olstowski ............... B01J 23/38
428/403
4,545,914 A * 10/1985 Graiver .................... C08K 7/04
252/502

(Continued)

FOREIGN PATENT DOCUMENTS

CN    103140953 A    6/2013
JP    2004-199900 A    7/2004
(Continued)

OTHER PUBLICATIONS

[NPL-1] "Particle Size / Mesh Conversion Chart"; (year: 2017), Powder Technology Inc.; <http://www.powdertechnologyinc.com/particle-size-mesh-conversion-chart/>.*
International Search Report and Written Opinion issued in corresponding International Patent Application No. PCT/KR2014/012606, dated Mar. 18, 2015.
(Continued)

*Primary Examiner* — David Sample
*Assistant Examiner* — Donald M Flores, Jr.
(74) *Attorney, Agent, or Firm* — McDermott Will & Emery LLP (57) ABSTRACT

The present invention relates to a metal encapsulant having good heat dissipation properties, a method of manufacturing same, and a flexible electronic device encapsulated in said metal encapsulant, and particularly, to a metal encapsulant having excellent flexibility, moisture resistance, workability, and heat dissipation properties by forming a coating layer (Continued)

including a metal graphite composite on one surface thereof, to a method of manufacturing same, and a flexible electronic device encapsulated in said metal encapsulant.

13 Claims, 6 Drawing Sheets

(51) Int. Cl.
  *B32B 9/04* (2006.01)
  *B32B 15/08* (2006.01)
  *B32B 27/28* (2006.01)
  *B32B 27/30* (2006.01)
  *B32B 27/32* (2006.01)
  *B32B 27/40* (2006.01)
  *H01L 51/44* (2006.01)

(52) U.S. Cl.
  CPC .......... *B32B 27/283* (2013.01); *B32B 27/302* (2013.01); *B32B 27/306* (2013.01); *B32B 27/308* (2013.01); *B32B 27/32* (2013.01); *B32B 27/322* (2013.01); *B32B 27/40* (2013.01); *H01L 51/448* (2013.01); *H01L 51/524* (2013.01); *H01L 51/5243* (2013.01); *B32B 2307/306* (2013.01); *B32B 2307/7265* (2013.01); *B32B 2439/00* (2013.01); *B32B 2457/00* (2013.01); *Y02E 10/549* (2013.01)

(56) References Cited

U.S. PATENT DOCUMENTS

| | | | |
|---|---|---|---|
| 7,027,304 | B2* | 4/2006 | Aisenbrey ........... B29C 45/0013 165/104.33 |
| 2008/0023665 | A1 | 1/2008 | Weiser et al. |
| 2010/0009193 | A1 | 1/2010 | Takeda et al. |
| 2011/0040007 | A1 | 2/2011 | Chandrasekhar et al. |
| 2011/0175102 | A1 | 7/2011 | Hatano |
| 2012/0009415 | A1 | 1/2012 | Shao et al. |
| 2013/0105203 | A1 | 5/2013 | Lee et al. |

FOREIGN PATENT DOCUMENTS

| | | |
|---|---|---|
| JP | 2011-038078 A | 2/2011 |
| JP | 2011-171288 A | 9/2011 |
| JP | 2011-222334 A | 11/2011 |
| KR | 10-2000-0031821 A | 6/2000 |
| KR | 10-2011-0113874 A | 10/2011 |
| KR | 10-2011-0129299 A | 12/2011 |
| KR | 10-2012-0006844 A | 1/2012 |
| KR | 10-2012-0089935 A | 8/2012 |
| KR | 10-2013-0105021 A | 9/2013 |
| KR | 10-1332362 A | 12/2013 |

OTHER PUBLICATIONS

Chinese Office Action dated Jan. 9, 2017 issued in Chinese Patent Application No. 201480069988.5 (with English translation).

* cited by examiner

METAL ENCAPSULANT HAVING GOOD HEAT DISSIPATION PROPERTIES, METHOD OF MANUFACTURING SAME, AND FLEXIBLE ELECTRONIC DEVICE ENCAPSULATED IN SAID METAL ENCAPSULANT

RELATED APPLICATIONS

This application is the U.S. National Phase under 35 U.S.C. § 371 of International Patent Application No. PCT/KR2014/012606, filed on Dec. 19, 2014, which in turn claims the benefit of Korean Application No. 10-2013-0160819, filed on Dec. 20, 2013, the disclosures of which Applications are incorporated by reference herein.

TECHNICAL FIELD

The present invention relates to a metal encapsulant having good heat dissipation properties generally used for encapsulating flexible electronic devices such as thin film solar cells, OLED illumination devices, display devices or printed circuit boards (PCB) in order to prevent the penetration of moisture and oxygen into the devices, and to effectively release heat generated inside the device, a method for manufacturing the same and a flexible electronic device encapsulated by the metal encapsulant.

BACKGROUND ART

Recently, as society has enters a full-scale information age, the field of displays for handling and displaying mass information has rapidly developed, and in response thereto, various flat panel displays have been developed and have received attention.

Independent examples of such flat panel display devices may include liquid crystal display (LCD) devices, plasma display panel (PDP) devices, field emission display (FED) devices, electroluminescence display (ELD) devices, and the like, and these are used in various fields, including the field of Information Technology in devices such as laptop computers, in the field of mobile communications in devices such as mobile phones, as well as in the field of consumer electronics in devices such as televisions and videos. Such flat panel display devices exhibit excellent characteristics in terms of thinning, lightening and reductions in the power consumption thereof, and have rapidly replaced cathode ray tube (CRT) displays that have been used in the art.

Particularly, OLED devices emit light by themselves and are capable of being operated at low voltages, and accordingly, have been adopted at a rapid pace in the area of small displays for products such as portable devices. In addition, OLEDs are facing commercialization beyond small displays in large televisions.

Meanwhile, flat panel display devices generally use glass materials in a substrate supporting the device and as an encapsulation layer preventing moisture penetration, and glass materials have limitations in allowing for lightening, thinning and flexibility. Accordingly, flexible display devices capable of maintaining a display function even when being bent like paper using flexible materials such as metal, plastic and polymer materials instead of existing glass encapsulants having no flexibility have recently emerged as next-generation flat panel display devices.

However, using encapsulants such as plastic or polymer materials in OLEDs has a disadvantage in that plastic or polymer materials have high moisture permeability and shorten a lifespan of OLEDs due to the penetration of moisture. In addition, there is a disadvantage in that heat generated inside display devices is not effectively released due to generally low heat dissipation efficiency, and improvements have therefore been required.

Meanwhile, metal encapsulants have a highly superior moisture preventing ability due to the nature thereof, and also have very excellent heat dissipation properties. However, preparing thin encapsulants using an existing rolling method has a disadvantage in that manufacturing costs rapidly increase as substrate thicknesses are reduced.

Accordingly, technologies for preparing metal encapsulants using an electroforming method have recently been proposed, and use of such an electroforming method is expected to be rapidly expanded due to its lower manufacturing costs compared to an existing rolling method.

However, while metal encapsulants prepared using an existing rolling method have a thickness of approximately 100 μm, metal encapsulants prepared using an electroforming method are formed to a thickness of 20 μm to 50 μm in order to secure the above-mentioned effects, and when the metal encapsulant is formed into an excessively thin film, the metal encapsulant has a disadvantage in that heat dissipation properties decline due to decreased heat capacity when heat generated inwardly thereof needs to absorbed by the metal encapsulant.

DISCLOSURE

Technical Problem

An aspect of the present invention provides a metal encapsulant having good heat dissipation properties, which is flexible, has excellent moisture preventing effects and has economic feasibility while having excellent heat dissipation properties, a method for manufacturing the metal encapsulant, and a flexible electronic device encapsulated by the metal encapsulant.

Technical Solution

According to an aspect of the present invention, there is provided a metal encapsulant having good heat dissipation properties including a metal foil; and a coating layer formed on one surface of the metal foil and including a main resin and a metal-graphite composite.

The metal foil may have a thickness of 8 μm to 100 μm, and the coating layer may have a thickness of 1 μm to 10 μm.

The metal-graphite composite in the coating layer may be included in an amount of 5% by weight to 20% by weight with respect to a total weight of the coating layer.

In the metal-graphite composite, a metal may bind to graphite in an amount of 20 parts by weight to 70 parts by weight with respect to 100 parts by weight of the graphite.

The main resin in the coating layer may be one or more selected from the group consisting of a polyurethane resin, a polyethylene resin, a polystyrene resin, a polypropylene resin, an ethylene vinyl acetate resin, an acrylic resin, a silicone resin and a fluorine resin.

The metal encapsulant having good heat dissipation properties may further include a heat conductive layer formed on the other surface of the metal foil and including a main resin and a metal-graphene composite.

The heat conductive layer may have a thickness of 0.1 μm to 5 μm.

The metal-graphene composite in the heat conductive layer may be included in an amount of 5% by weight to 20% by weight based on a total weight of the heat conductive layer.

In the metal-graphene composite, a metal may bind to graphene in an amount of 20 parts by weight to 70 parts by weight with respect to 100 parts by weight of the graphene.

The metal may have an average particle size of 10 nm to 100 nm.

The main resin in the heat conductive layer may be one or more selected from the group consisting of a polyurethane resin, a polyethylene resin, a polystyrene resin, a polypropylene resin, an ethylene vinyl acetate resin, an acrylic resin, a silicone resin and a fluorine resin.

According to another aspect of the present invention, there is provided a flexible electronic device encapsulated by a metal encapsulant, the device including an adhesive film layer laminated on top of the flexible electronic device, and the metal encapsulant encapsulating the flexible electronic device by being laminated on top of the adhesive film layer, wherein the metal encapsulant is laminated on the top of the adhesive film layer so that the coating layer is disposed to face ambient atmosphere.

Advantageous Effects

According to an aspect of the present invention, a metal encapsulant having good heat dissipation properties significantly enhancing, by forming a coating layer including a metal-graphite composite on one surface, heat dissipation properties as well as flexibility, moisture resistance and workability, and thereby capable of effectively releasing heat generated in an encapsulated device and preventing problems such as failures caused by the heat, a method for manufacturing the metal encapsulant, and a flexible electronic device encapsulated by the metal encapsulant can be provided.

BEST MODE

Hereinafter, a metal encapsulant, a method for manufacturing the same, and a flexible electronic device encapsulated by the metal encapsulant of the present invention will be described in detail with reference to the accompanying drawings. The drawings are attached hereto to help explain exemplary embodiments of the invention, and the present invention is not limited to the drawings and embodiments. In the drawings, some elements may be exaggerated, reduced in size, or omitted for clarity or conciseness.

An aspect of the present invention relates to a metal encapsulant for flexible electronic devices such as thin film solar cells, OLED illumination devices, display devices or printed circuit boards (PCB), and specifically, provides a metal encapsulant having good heat dissipation properties including a metal foil; and a coating layer formed on one surface of the metal foil and including a main resin and a metal-graphite composite.

Herein, the metal foil is prepared to a thickness of 8 μm to 100 μm and more preferably, 8 μm to 50 μm, using a rolling method or an electroforming method, and metal components forming the metal foil may vary depending on the technological field in which the metal encapsulant is used, but for example, the metal foil may be formed of any alloy selected from among Fe—Ni-based alloys, Fe—Cr-based alloys and Fe—Cu-based alloys, and among these, forming with the Fe—Ni alloy may particularly optimize a coefficient of thermal expansion by controlling the Ni content, and in addition, the Fe—Ni alloy is a material capable of readily securing corrosion resistance and the Fe—Ni alloy is readily formed when prepared through an electroforming method.

Meanwhile, the metal encapsulant provided in the present invention needs to prevent the penetration of moisture and oxygen into a device and needs to effectively release heat generated inside the device as well, and therefore, preferably has excellent heat dissipation properties.

However, the metal-graphite composite is a material having excellent heat dissipation properties, and in the present invention, heat dissipation properties of the metal encapsulant may be significantly enhanced by forming a coating layer including a metal-graphite composite on any one surface of both surfaces of metal foil so that a part contacting ambient atmosphere effectively releases heat transferred to the metal foil to the ambient atmosphere. Moreover, by the coating layer including the metal-graphite composite, heat conductivity may also be enhanced as well as heat dissipation properties. In other words, the function of the coating layer is not limited to that of a heat dissipating layer.

In addition, a metal-graphene composite is a material having high heat conductivity, and therefore, a heat conductive layer including a metal-graphene composite may be additionally formed on a part adjacent to a heat source so that heat generated by the heat source is favorably transferred to the metal foil.

First, the coating layer formed on one surface of the metal foil in the metal encapsulant of the present invention will be specifically described.

The coating layer preferably has a thickness of 1 μm to 10 μm and more preferably 2 μm to 8 μm. When the thickness is less than 1 μm, the efficiency of heat conductivity may be insignificant, and a thickness greater than 10 μm leads to a problem of manufacturing costs increasing due to the excessive thickness.

In addition, the coating layer may include a main resin and a metal-graphite composite. Herein, the metal-graphite composite is preferably included in an amount of 5% by weight to 20% by weight and more preferably in an amount of 8% by weight to 15% by weight based on the total weight of the coating layer. When the content of the metal-graphite composite is less than 5% by weight, an effect of heat dissipation property enhancement is low, while a content greater than 20% by weight has a problem of reducing economic feasibility.

Types of the main resin included in the coating layer are not particularly limited, and examples thereof may include one or more selected from the group consisting of a polyurethane resin, a polyethylene resin, a polystyrene resin, a polypropylene resin, an ethylene vinyl acetate resin, an acrylic resin, a silicone resin and a fluorine resin.

The metal-graphite composite included in the coating layer may be formed by a metal binding to graphite, and although a manufacturing process thereof is not particularly limited, those formed by fusing graphite and metal powder in high temperature plasma having a temperature of approximately 14000° C. or higher using a special process may be used as an example.

The metal binding to the graphite is not particularly limited as long as it is a metal capable of forming a metal-graphite composite, and metal particles having an average particle size of 10 nm to 100 nm may be used. One example of the metal particles may include a single metal selected from the group consisting of aluminum (Al), copper (Cu), silver (Ag), gold (Au), iron (Fe), tin (Sn), zinc (Zn) and nickel (Ni), or an alloy including one or more types of these metal particles.

The average particle size of the metal being smaller than 10 nm may lead to unnecessarily fine particles causing a unit cost increase of raw materials, whereas the average particle size being larger than 100 nm may be disadvantageous in enhancing heat dissipation properties since the surface area per unit weight is small.

In addition, the metal preferably binds to the graphite in an amount of 20 parts by weight to 70 parts by weight and more preferably 30 parts by weight to 50 parts by weight with respect to 100 parts by weight of the graphite. When the content is less than 20 parts by weight, an effect of heat dissipation property enhancement contributed by the metal may be insignificant, and when the content included in an amount greater than 70 parts by weight, heat dissipation properties may decline due to residual metal particles that have not been able to bind to the graphite.

As described above, the present invention allows the heat generated inside a device and transferred to a metal encapsulant to be effectively released to ambient atmosphere by forming a coating layer on one surface of metal foil.

Next, in the metal encapsulant of the present invention, the heat conductive layer that may be formed on a surface other than the surface on which the coating layer is formed will be specifically described.

The heat conductive layer preferably has a thickness of 0.1 μm to 5 μm and more preferably 1 μm to 3 μm. When the thickness is less than 0.1 μm, efficiency of heat conductivity may be insignificant, while a thickness greater than 5 μm leads to a problem of an increase in manufacturing costs due to the excessive thickness.

In addition, the heat conductive layer may include a main resin and a metal-graphene composite. Herein, the metal-graphene composite is preferably included in an amount of 5% by weight to 20% by weight and more preferably in an amount of 8% by weight to 15% by weight based on the total weight of the heat conductive layer. When the content of the metal-graphene composite included in an amount greater than 20% by weight, the composite may not be evenly dispersed into the main resin and an effect of further heat dissipation property enhancement is difficult to be expected, and when the content is less than 5% by weight, an effect of heat conductivity enhancement is small.

Types of the main resin included in the heat conductive layer are not particularly limited, and examples thereof may include one or more selected from the group consisting of a polyurethane resin, a polyethylene resin, a polystyrene resin, a polypropylene resin, an ethylene vinyl acetate resin, an acrylic resin, a silicone resin and a fluorine resin.

The metal-graphene composite included in the heat conductive layer may be formed by a metal binding to graphene, and although a manufacturing process thereof is not particularly limited, those formed by fusing graphene and metal powder in high temperature plasma of approximately 14000° C. or higher using a special process may be used as an example.

The metal binding to the graphene is not particularly limited as long as it is a metal capable of forming a metal-graphene composite, and metal particles having an average particle size of 10 nm to 100 nm may be used. One example of the metal particles may include a single metal selected from the group consisting of aluminum (Al), copper (Cu), silver (Ag), gold (Au), iron (Fe), tin (Sn), zinc (Zn) and nickel (Ni), or an alloy including one or more types of these metal particles.

In the above, the average particle size of the metal being smaller than 10 nm may lead to unnecessarily fine particles causing a unit cost increase of raw materials, whereas the average particle size being larger than 100 nm may be disadvantageous in enhancing heat conductivity, since the surface area per unit weight is small.

In addition, the metal preferably binds to the graphene in an amount of 20 parts by weight to 70 parts by weight and more preferably 30 parts by weight to 50 parts by weight with respect to 100 parts by weight of the graphene. When the content is less than 20 parts by weight, an effect of heat dissipation property enhancement contributed by the metal may be insignificant, and when the content included in an amount greater than 70 parts by weight, heat conductivity may decrease due to residual metal particles that have not been able to bind to the graphene.

As described above, the present invention is capable of transferring heat generated from a heat source inside a device to metal foil by forming a heat conductive layer on one surface of the metal foil.

Another embodiment of the present invention relates to a method for manufacturing a metal encapsulant having good heat dissipation properties, and specifically, provides a method for manufacturing a metal encapsulant having good heat dissipation properties including preparing metal foil; forming a coating layer by applying a heat dissipating composition including a main resin and a metal-graphite composite to one surface of the metal foil.

In addition, the method may further include forming a heat conductive layer by applying a heat conductive composition including a main resin and a metal-graphene composite to the other surface of the metal foil.

First, in the present invention foil made of a metal material capable of being used in encapsulating a device may be prepared. Herein, the metal foil has a thickness of 8 μm to 100 μm and more preferably 8 μm to 50 μm, and although a manufacturing process thereof is not particularly limited, a rolling method or an electroforming method may be used.

Types of the metal material forming the foil are not particularly limited as long as it is capable of effectively releasing heat generated inside a device and preventing the penetration of moisture and oxygen into the device, and type may vary depending on the technological field of a device in which the metal encapsulant is used. However, examples of the materials having the properties described above may include any one alloy selected from among Fe—Ni-based alloys, Fe—Cr-based alloys and Fe—Cu-based alloys, and among these, forming with the Fe—Ni alloy may particularly optimize a coefficient of thermal expansion by controlling the Ni content, and in addition, the Fe—Ni alloy is a material capable of readily securing corrosion resistance and the Fe—Ni alloy is readily formed when prepared through an electroforming method.

When the metal foil is prepared as above, the present invention may carry out forming a coating layer by applying a heat dissipating composition including a main resin and a metal-graphite composite to one surface of the metal foil. In addition, the present invention may further include forming a heat conductive layer by applying a heat conductive composition including a main resin and a metal-graphene composite to the other surface of the metal foil.

However, in the manufacturing method of the present invention, an order of applying the heat conductive composition or the heat dissipating composition to the surface of the metal foil is not particularly limited, and the heat conductive composition may be applied first on any one surface of the metal foil and then the heat dissipating composition is applied to the other surface, or the heat dissipating composition may be applied first on any one surface of the metal foil and then the heat conductive composition is applied to the other surface, and in some cases, the heat conductive composition and the heat dissipating composition may be simultaneously applied to each of both surfaces.

In the manufacturing method of the present invention, the process of applying a heat conductive composition or a heat dissipating composition to the surface of the metal foil is not particularly limited, but using methods such as slot die is more preferable.

Hereinafter, the heat dissipating composition used in the manufacturing method of the present invention will be specifically described.

The heat dissipating composition may include a main resin and a metal-graphite composite. Herein, the metal-graphite composite is preferably included in an amount of 5% by weight to 20% by weight and more preferably in 8% by weight to 15% by weight based on the total weight of the heat dissipating composition. When the content of the metal-graphite composite is less than 5% by weight, an effect of heat dissipation property enhancement is small, while a content greater than 20% by weight has a problem of reducing economic feasibility.

Types of the main resin included in the heat dissipating composition are not particularly limited, and examples thereof may include one or more selected from the group consisting of a polyurethane resin, a polyethylene resin, a polystyrene resin, a polypropylene resin, an ethylene vinyl acetate resin, an acrylic resin, a silicone resin and a fluorine resin.

The metal-graphite composite included in the heat dissipating composition may be formed by a metal binding to graphite, and although a manufacturing process thereof is not particularly limited, those formed by fusing graphite and metal powder in high temperature plasma of approximately 14000° C. or higher using a special process may be used as an example.

The metal binding to the graphite is not particularly limited as long as it is a metal capable of forming a metal-graphite composite, and metal particles having an average particle size of 10 nm to 100 nm may be used. One example of the metal particles may include a single metal selected from the group consisting of aluminum (Al), copper (Cu), silver (Ag), gold (Au), iron (Fe), tin (Sn), zinc (Zn) and nickel (Ni), or an alloy including one or more types of these metal particles.

The average particle size of the metal being smaller than 10 nm may lead to unnecessarily fine particles causing a unit cost increase of raw materials, whereas the average particle size being larger than 100 nm may be disadvantageous in enhancing heat dissipation properties since the surface area per unit weight is small.

In addition, the metal preferably binds to the graphite in an amount of 20 parts by weight to 70 parts by weight and more preferably 40 parts by weight to 50 parts by weight with respect to 100 parts by weight of the graphite. When the content is less than 20 parts by weight, an effect of heat dissipation property enhancement contributed by the metal may be insignificant, and when the content included in an amount greater than 70 parts by weight, heat dissipation properties may decline due to residual metal particles that have not been able to bind to the graphite.

Next, the heat conductive composition used in the manufacturing method of the present invention will be described in detail.

As described above, the heat conductive composition used in the present invention may include a metal-graphene composite and a main resin, and herein, the metal-graphene composite is preferably included in an amount of 5% by weight to 20% by weight and more preferably in an amount of 8% by weight to 15% by weight based on the total weight of the composition. When the content of the metal-graphene composite included in an amount greater than 20% by weight, the composite may not be evenly dispersed into the main resin and an effect of further heat dissipation property enhancement is difficult to be expected, and when the content is less than 5% by weight, an effect of heat conductivity enhancement is small.

Types of the main resin included in the heat conductive composition are not particularly limited, and examples thereof may include one or more selected from the group consisting of a polyurethane resin, a polyethylene resin, a polystyrene resin, a polypropylene resin, an ethylene vinyl acetate resin, an acrylic resin, a silicone resin and a fluorine resin.

The metal-graphene composite included in the heat conductive composition may be formed by a metal binding to graphene, and although a manufacturing process thereof is not particularly limited, those formed by fusing graphene and metal powder in high temperature plasma of approximately 14000° C. or higher using a special process may be used as an example.

The metal binding to the graphene is not particularly limited as long as it is a metal capable of forming a metal-graphene composite, and metal particles having an average particle size of 10 nm to 100 nm may be used. One example of the metal particles may include a single metal selected from the group consisting of aluminum (Al), copper (Cu), silver (Ag), gold (Au), iron (Fe), tin (Sn), zinc (Zn) and nickel (Ni), or an alloy including one or more types of these metal particles.

In the above, the average particle size of the metal being smaller than 10 nm may lead to unnecessarily fine particles causing a unit cost increase of raw materials, whereas the average particle size being larger than 100 nm may be disadvantageous in enhancing heat conductivity since the surface area per unit weight is small.

In addition, the metal preferably binds to the graphene in an amount of 20 parts by weight to 70 parts by weight and more preferably 30 parts by weight to 50 parts by weight with respect to 100 parts by weight of the graphene. When the content is less than 20 parts by weight, an effect of heat dissipation property enhancement contributed by the metal may be insignificant, and when the content included in an amount greater than 70 parts by weight, heat conductivity may decrease due to residual metal particles that have not been able to bind to the graphene.

The manufacturing method of the present invention forms a coating layer on one surface of metal foil by applying the heat dissipating composition to the surface of the metal foil, and therefore, transfers heat generated inside a flexible electronic device to a metal encapsulant and thereby effectively releases the heat to the ambient atmosphere, and as a result, may prevent problems such as failures caused by failing to dissipate heat generated inside a device.

Herein, the coating layer preferably has a thickness of 1 µm to 10 µm and more preferably 3 µm to 8 µm. When the thickness is less than 1 µm, efficiency of heat conductivity may be insignificant, while a thickness greater than 10 µm leads to a problem of an increase in manufacturing costs due to the excessive thickness.

In addition, the heat conductive layer preferably has a thickness of 0.1 µm to 5 µm and more preferably 1 µm to 3 µm. When the thickness is less than 0.1 µm, efficiency of heat conductivity may be insignificant, while a thickness greater than 5 µm leads to a problem of an increase in manufacturing costs due to the excessive thickness.

Still another embodiment of the present invention relates to a flexible electronic device encapsulated using the metal encapsulant of the present invention, and this represents one example of applications of the metal encapsulant of the present invention, and the present invention is not limited thereto.

As the flexible electronic device provided in the present invention, the flexible electronic device may specifically include an adhesive film layer laminated on the top of the flexible electronic device; and the metal encapsulant provided in the present invention as a constituent encapsulating the flexible electronic device by being laminated on the top of the adhesive film layer.

However, in the metal encapsulant, a coating layer including a metal-graphite composite having excellent heat dissipation properties is formed, and therefore, when the present invention uses the metal encapsulant to encapsulate a flexible electronic device, the metal encapsulant needs to be disposed on the top of the adhesive film layer so that the coating layer in the metal encapsulant faces ambient atmosphere in order to effectively release heat generated in a device to ambient atmosphere through the coating layer after the heat is transferred to metal foil.

Meanwhile, a substrate capable of being used with the flexible electronic device of the present invention is not particularly limited, and those generally used as a substrate in flexible electronic devices may be used without limitation. For example, glass, polymer films, plastic or the like may be used.

In addition, the flexible electronic device is laminated on the substrate. One example of such a flexible electronic device may include an OLED light emitting layer, and descriptions will be made with the OLED light emitting layer as an example. An example of encapsulating such an OLED light emitting layer with the metal encapsulant according to the present invention is shown in FIG. 1.

Figure 1:
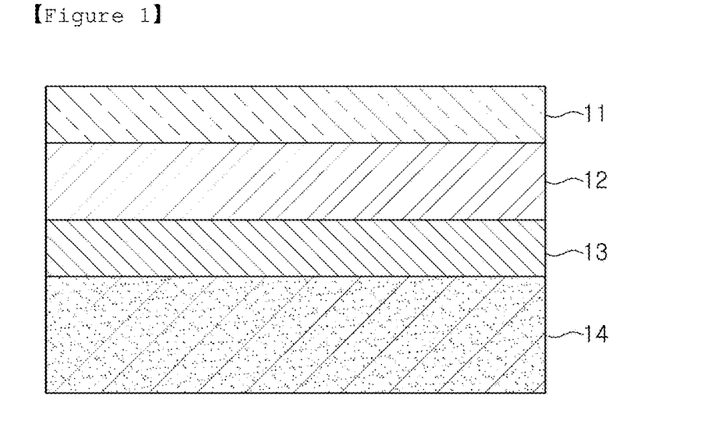
FIG. 1 is an example of a flexible electronic device of the present invention, and shows a cross-sectional conceptual diagram of an OLED light emitting layer encapsulated by a metal encapsulant.

FIG. 1 is a cross-sectional conceptual diagram of an OLED light emitting layer encapsulated using the metal encapsulant of the present invention, and a metal encapsulant in which a coating layer including metal-graphite is formed on one surface is laminated on the top of an OLED light emitting layer functioning as a heat source with an adhesive film layer as a medium. However, in the metal encapsulant, the coating layer included therein is disposed to be in contact with ambient atmosphere so that heat generated in the light emitting layer is effectively released to ambient atmosphere through the coating layer after being effectively transferred to the metal encapsulant.

In addition, the adhesive film layer in the present invention enables the metal encapsulant to be brought into contact with the flexible electronic device for encapsulation, and the adhesive film layer preferably includes a thermally curable resin or a photocurable resin so that the lamination structure of the flexible electronic device and the metal encapsulant adheres by the adhesive film layer being cured from heating or ultraviolet irradiation.

Herein, the thermally curable resin or the photocurable resin is not particularly limited, and those commonly used in the art may be used in the present invention. Examples of the thermally curable resin may include resins such as phenol, melamine, epoxy and polyester, and for example, araldite products may be used. Furthermore, epoxy, urethane, polyester resins and the like may be used as the photocurable resin, and examples thereof may include XNR5570-B1 and the like manufactured and sold by NAGASE & Co., Ltd.

A thickness of the adhesive film layer is not particularly limited, but the adhesive film layer is preferably formed to a thickness of 90 µm to 110 µm, a range sufficient to adhere the flexible electronic device and the metal encapsulant without declining heat dissipation properties of the metal encapsulant.

Analysis Example: Analysis of Metal-Graphite Composite

Figure 2:
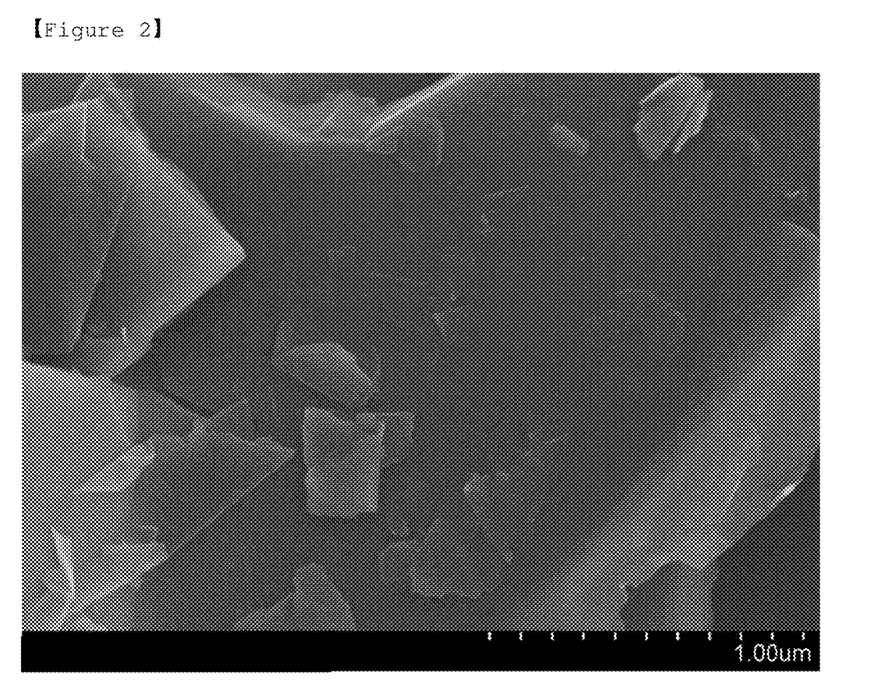
FIG. 2 is diagram illustrating SEM analysis of a graphite raw material.
Figure 3:
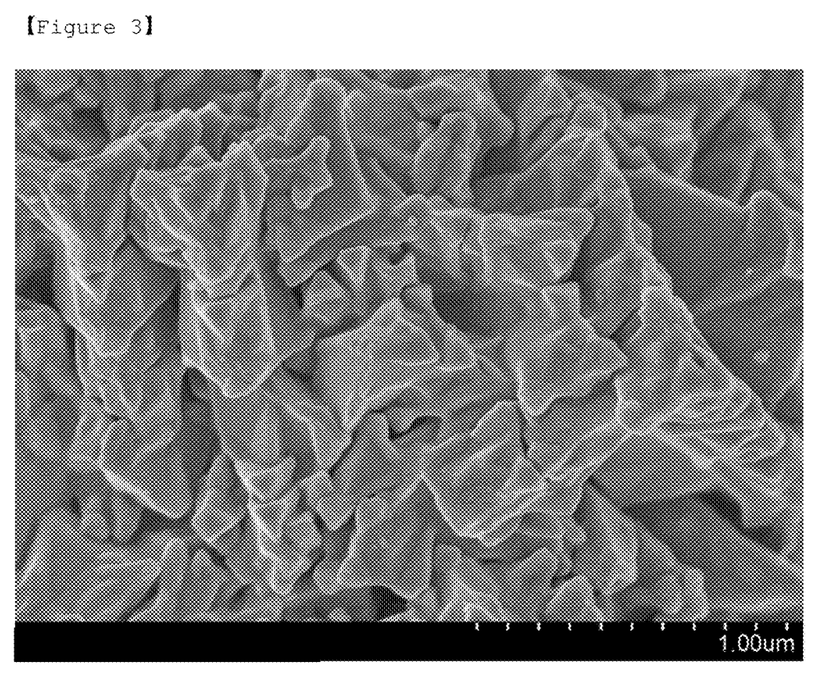
FIG. 3 is diagram illustrating SEM analysis of a nickel raw material.
Figure 4:
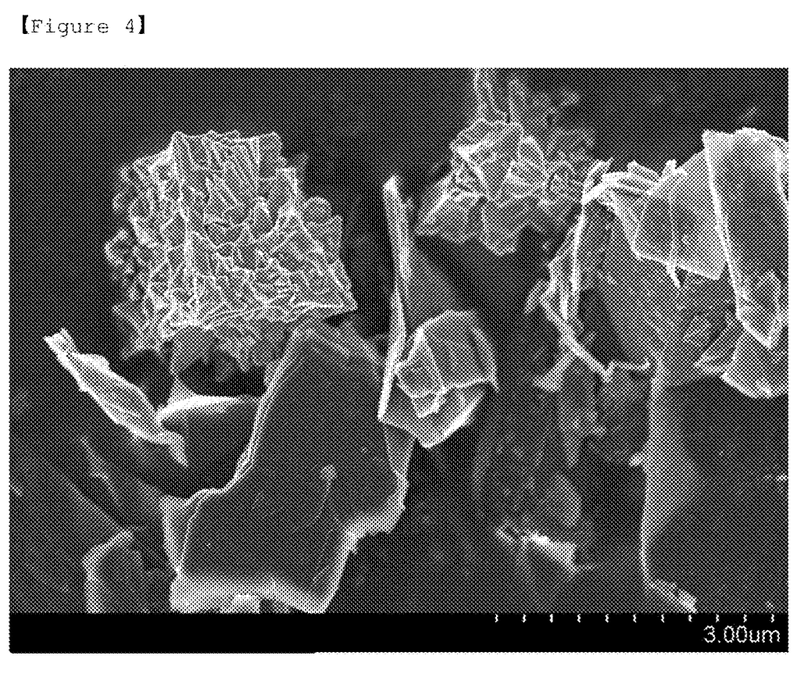
FIG. 4 is diagram illustrating SEM analysis of a mixture of graphite and nickel.
Figure 5:
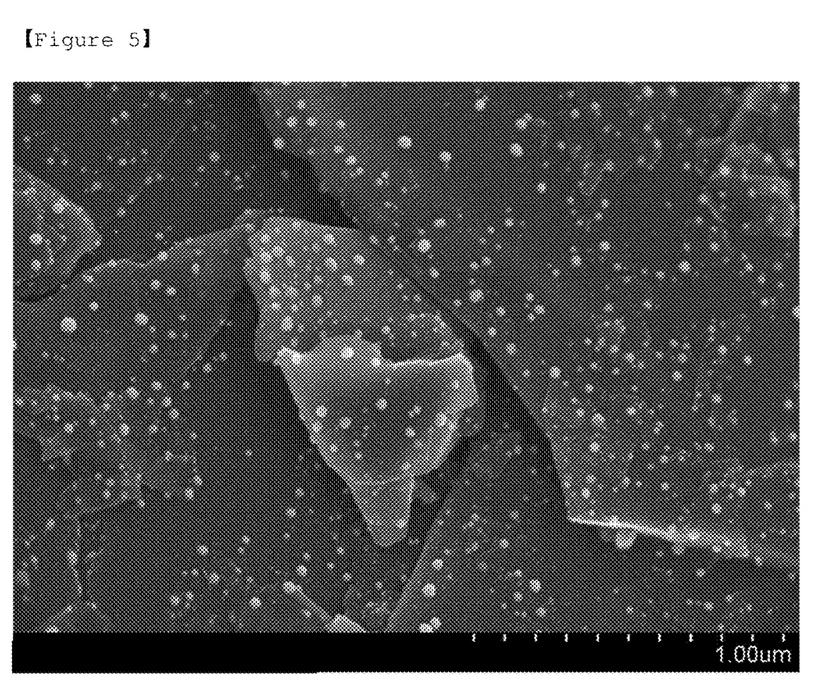
FIG. 5 is diagram illustrating SEM analysis of a nickel-graphite composite.

FIG. 2 is a diagram illustrating a SEM analysis result of a graphite raw material, FIG. 3 is a diagram illustrating a SEM analysis result of a nickel raw material, FIG. 4 is a diagram illustrating a SEM analysis result of a mixture of graphite and nickel and FIG. 5 is a diagram illustrating a SEM analysis result of a nickel-graphite composite. From these, it can be seen that, when the graphite and the nickel are mixed, forms of the raw materials are maintained, however, in the nickel-graphite composite, the nickel particles that have become nano-sized are uniformly dispersed into the graphite to form a composite.

Figure 6:
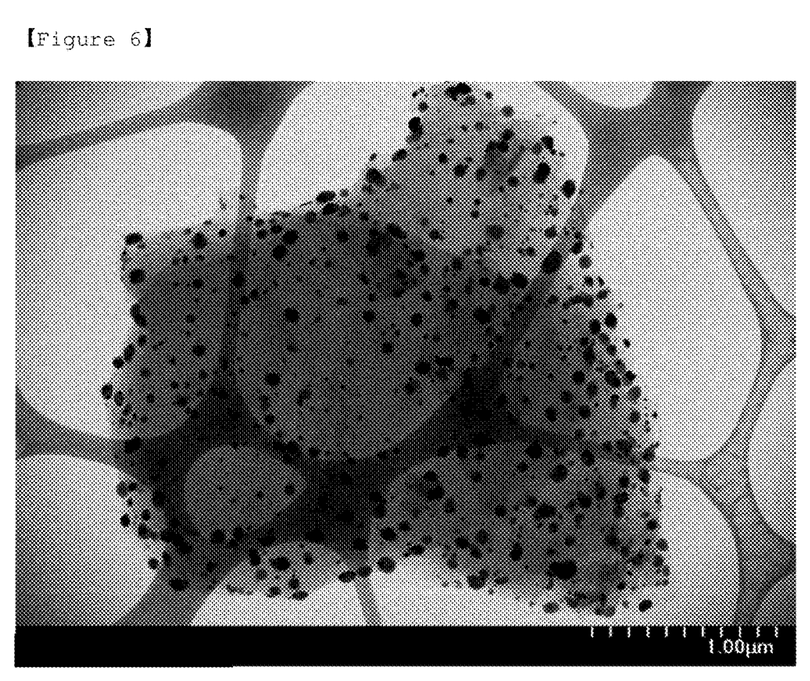
FIG. 6 is a TEM micrograph of a nickel-graphite composite.

Specifically, FIG. 6 is a TEM analysis result of the nickel-graphite composite, and it was identified that the nickel particles that had become nano-sized were uniformly dispersed into the graphite to form a composite.

Example 1

A metal encapsulant including a coating layer that includes urethane-acrylate as a main resin and metal-graphite composite on one surface of metal foil (STS 430) having a thickness of 50 µm was prepared, and an OLED device encapsulated by the metal encapsulant was manufactured. Herein, the metal-graphite composite used a Ni-graphite composite including 30% by weight of nickel and 70% by weight of graphite.

Example 2

A metal encapsulant including a coating layer that includes urethane-acrylate as a main resin and metal-graphite composite on one surface of metal foil (STS 430) having a thickness of 50 µm was prepared, and an OLED device encapsulated by the metal encapsulant was manufactured. Herein, the metal-graphite composite was a Ni-graphite composite including 30% by weight of nickel and 70% by weight of graphite, and the Ni-graphite composite was mixed so as to be included in an amount of 5% by weight with respect to the total weight of the coating layer.

Example 3

An OLED device was manufactured in the same manner as in Example 2 except that the Ni-graphite composite was mixed so as to be included in an amount of 10% by weight with respect to the total weight of the coating layer.

Example 4

An OLED device was manufactured in the same manner as in Example 2 except that the Ni-graphite composite was mixed so as to be included in an amount of 20% by weight with respect to the total weight of the coating layer.

Comparative Example 1

A metal encapsulant coating metal foil (STS 430) having a thickness of 50 µm was prepared with urethane-acrylate, and an OLED device encapsulated by the metal encapsulant was manufactured.

Comparative Example 2

A metal encapsulant including a coating layer that includes urethane-acrylate as a main resin and graphite on one surface of metal foil (STS 430) having a thickness of 50 µm was prepared, and an OLED device encapsulated by the metal encapsulant was manufactured. Herein, the graphite was mixed so to be included in an amount of 5% by weight with respect to the total weight of the coating layer.

Comparative Example 3

An OLED device was manufactured in the same manner as in Comparative Example 2 except that the graphite was mixed so as to be included in an amount of 10% by weight with respect to the total weight of the coating layer.

Comparative Example 4

An OLED device was manufactured in the same manner as in Comparative Example 2 except that the graphite was mixed so as to be included in an amount of 20% by weight with respect to the total weight of the coating layer.

Test Example

Figure 7:
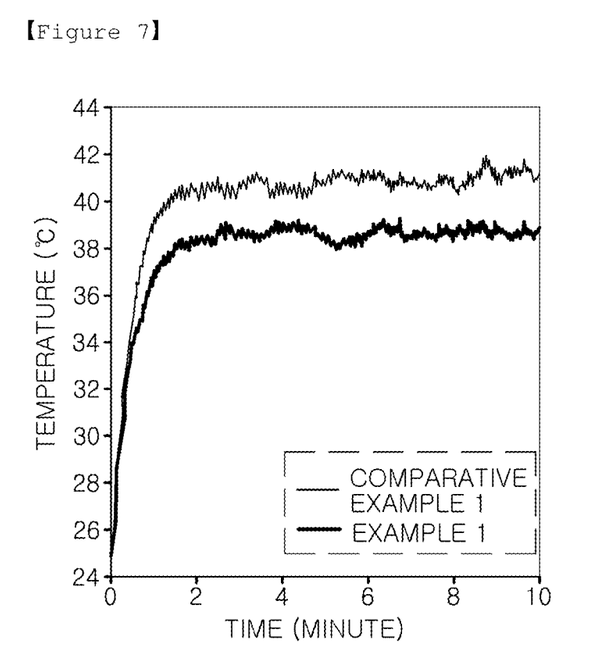
FIG. 7 is a graph showing heat dissipation properties of Example 1 and Comparative Example 1.

Using the OLED devices manufactured in Example 1 and Comparative Example 1, heat dissipation properties were measured, and the results are shown in FIG. 7. As seen in FIG. 7, in the OLED device encapsulated by the metal encapsulant coated only with urethane-acrylate, a general paint, the temperature increased up to a maximum of 40.5° C., whereas, in the OLED device encapsulated by the metal encapsulant of Example 1, the temperature increased up to a maximum of 38° C., and it was identified that the metal encapsulant of Example 1 had excellent heat dissipation properties compared to the metal encapsulant of Comparative Example 1.

Figure 8:
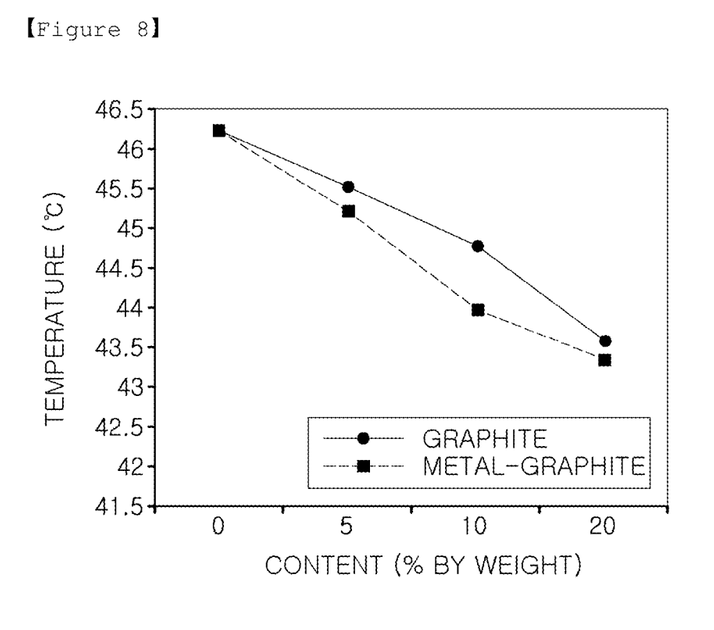
FIG. 8 is a graph showing heat dissipation properties of Examples 2 to 4 and Comparative Examples 1 to 4.

In addition, heat dissipation properties of the OLED devices manufactured in Examples 2 to 4 and Comparative Examples 1 to 4 were measured, and the results are shown in the following Table 1 and FIG. 8.

TABLE 1

| | Heat Dissipating Component in Coating Layer | Content (% by Weight) | Temperature (° C.) |
|---|---|---|---|
| Example 2 | Ni-Graphite | 5 | 45.25 |
| Example 3 | Ni-Graphite | 10 | 43.99 |
| Example 4 | Ni-Graphite | 20 | 43.34 |
| Comparative Example 1 | — | — | 46.23 |
| Comparative Example 2 | Graphite | 5 | 45.5 |
| Comparative Example 3 | Graphite | 10 | 44.77 |
| Comparative Example 4 | Graphite | 20 | 43.58 |

As can be seen from the results of Table 1, it was seen that, the devices of Examples 2 to 4 including a metal-graphite composite in the coating layer exhibited excellent heat dissipation properties and lower temperatures were measured compared to the devices of Comparative Examples 2 to 4 including graphite in the coating layer.

REFERENCE NUMERALS

11: COATING LAYER (1 MM TO 10 MM, METAL-GRAPHITE)
12: METAL FOIL (20 MM TO 100 MM)
13: ADHESIVE FILM LAYER (90 MM TO 110 MM)
14: OLED LIGHT EMITTING LAYER

The invention claimed is:
1. A metal encapsulant having heat dissipation properties comprising:
   metal foil; and
   a coating layer formed on one surface of the metal foil and including a main resin and a metal-graphite composite, wherein the metal foil has a thickness of 8 µm to 100 µm.
2. The metal encapsulant having heat dissipation properties of claim 1, wherein the coating layer has a thickness of 1 µm to 10 µm.
3. The metal encapsulant having heat dissipation properties of claim 1, wherein the metal-graphite composite in the coating layer is included in an amount of 5% by weight to 20% by weight with respect to a total weight of the coating layer.
4. The metal encapsulant having heat dissipation properties of claim 1, wherein, in the metal-graphite composite, a metal binds to graphite in an amount of 20 parts by weight to 70 parts by weight with respect to 100 parts by weight of the graphite.
5. The metal encapsulant having heat dissipation properties of claim 4, wherein the metal has an average particle size of 10 nm to 100 nm.
6. The metal encapsulant having heat dissipation properties of claim 1, wherein the main resin in the coating layer is one or more selected from the group consisting of a polyurethane resin, a polyethylene resin, a polystyrene resin, a polypropylene resin, an ethylene vinyl acetate resin, an acrylic resin, a silicone resin and a fluorine resin.

7. The metal encapsulant having heat dissipation properties of claim 1, further comprising a heat conductive layer formed on the other surface of the metal foil and including a main resin and a metal-graphene composite.

8. The metal encapsulant having heat dissipation properties of claim 7, wherein the heat conductive layer has a thickness of 0.1 μm to 5 μm.

9. The metal encapsulant having heat dissipation properties of claim 7, wherein the metal-graphene composite in the heat conductive layer is included in an amount of 5% by weight to 20% by weight based on a total weight of the heat conductive layer.

10. The metal encapsulant having heat dissipation properties of claim 7, wherein, in the metal-graphene composite, a metal binds to graphene in an amount of 20 parts by weight to 70 parts by weight with respect to 100 parts by weight of the graphene.

11. The metal encapsulant having heat dissipation properties of claim 10, wherein the metal has an average particle size of 10 nm to 100 nm.

12. The metal encapsulant having heat dissipation properties of claim 7, wherein the main resin in the heat conductive layer is one or more selected from the group consisting of a polyurethane resin, a polyethylene resin, a polystyrene resin, a polypropylene resin, an ethylene vinyl acetate resin, an acrylic resin, a silicone resin and a fluorine resin.

13. A flexible electronic device encapsulated by the metal encapsulant of claim 1, the flexible electronic device comprising:
    an adhesive film layer laminated on top of the flexible electronic device; and
    the metal encapsulant encapsulating the flexible electronic device by being laminated on top of the adhesive film layer,
    wherein the metal encapsulant is laminated on the top of the adhesive film layer so that the coating layer is disposed to face ambient atmosphere.

* * * * *